(12) United States Patent
Viswanathan et al.

(10) Patent No.: US 6,724,079 B2
(45) Date of Patent: Apr. 20, 2004

(54) WIRE BOND-LESS ELECTRONIC COMPONENT FOR USE WITH AN EXTERNAL CIRCUIT AND METHOD OF MANUFACTURE

(75) Inventors: Lakshminarayan Viswanathan, Phoenix, AZ (US); Pierre-Marie Piel, Tempe, AZ (US); Garry D. Funk, Scottsdale, AZ (US); Robert Paul Davidson, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/039,800

(22) Filed: Jan. 4, 2002

(65) Prior Publication Data

US 2003/0128080 A1 Jul. 10, 2003

(51) Int. Cl.⁷ .............................................. H01L 23/12
(52) U.S. Cl. ..................... 257/704; 257/341; 257/343; 257/401; 257/666; 257/668; 257/789; 257/791; 361/792
(58) Field of Search ................................ 257/321, 343, 257/401, 666, 668, 789, 791; 361/792

(56) References Cited

U.S. PATENT DOCUMENTS

| | | | |
|---|---|---|---|
| 5,023,624 A | 6/1991 | Heckaman et al. | |
| 5,241,456 A | * 8/1993 | Marcinkiewicz et al. | ... 361/792 |
| 5,998,875 A | 12/1999 | Bodö et al. | |
| 6,072,211 A | 6/2000 | Miller et al. | |
| 6,072,238 A | 6/2000 | Viswanathan et al. | |
| 6,261,868 B1 | 7/2001 | Miller et al. | |

FOREIGN PATENT DOCUMENTS

| | | |
|---|---|---|
| EP | 1079433 | 2/2001 |
| JP | 11031757 | 2/1999 |
| JP | 2001053197 | 2/2001 |

* cited by examiner

*Primary Examiner*—Son L. Mai
*Assistant Examiner*—Mai-Huong Tran
(74) *Attorney, Agent, or Firm*—Bryan Cave LLP

(57) ABSTRACT

A wire bond-less electronic component is for use with a circuit external to the wire bond-less electronic component. The wire bond-less electronic component includes a support substrate (110, 410), an electronic device (130) over the support substrate, and a cover (140, 440, 540) located over the electronic device and the support substrate. The cover includes an interconnect structure (141, 441, 541) electrically coupled to the electronic device and adapted to electrically couple together the electronic device and the circuit for providing impedance transformation of an electrical signal between the electronic device and the circuit.

25 Claims, 3 Drawing Sheets

WIRE BOND-LESS ELECTRONIC COMPONENT FOR USE WITH AN EXTERNAL CIRCUIT AND METHOD OF MANUFACTURE

FIELD OF THE INVENTION

This invention relates to electronics, in general, and to wire bond-less electronic components for use with an external circuit and a method of manufacture, in particular.

BACKGROUND OF THE INVENTION

Electronic components containing semiconductor devices and electrical leads often use wire bonds to electrically couple together the semiconductor devices and the electrical leads. The inductances of the wire bonds, however, limit the radio frequency or other high frequency performance of these electronic components by limiting the operational frequency bandwidth of the semiconductor devices.

In an attempt to alleviate this problem, other electronic components use wire bond-less interconnect schemes to electrically couple together the semiconductor devices and the electrical leads. These other electronic components, however, are still limited in terms of their operational frequency bandwidth because of their limited impedance transformation capabilities.

Some of these other electronic components also use large, space-consuming power combining manifolds to increase the power provided by the electronic components. Other ones of these other electronic components also use large, space-consuming impedance matching networks to increase the operational frequency bandwidth of the semiconductor devices. Therefore, these improvements in these other electronic components require the use of large electronic components.

Accordingly, a need exists for electronic components having improved operational frequency bandwidth and smaller sizes. A need also exists for methods of manufacturing these electronic components.

BRIEF DESCRIPTION OF THE DRAWINGS

The invention will be better understood from a reading of the following detailed description, taken in conjunction with the accompanying figures in the drawings in which.

Figure 1:
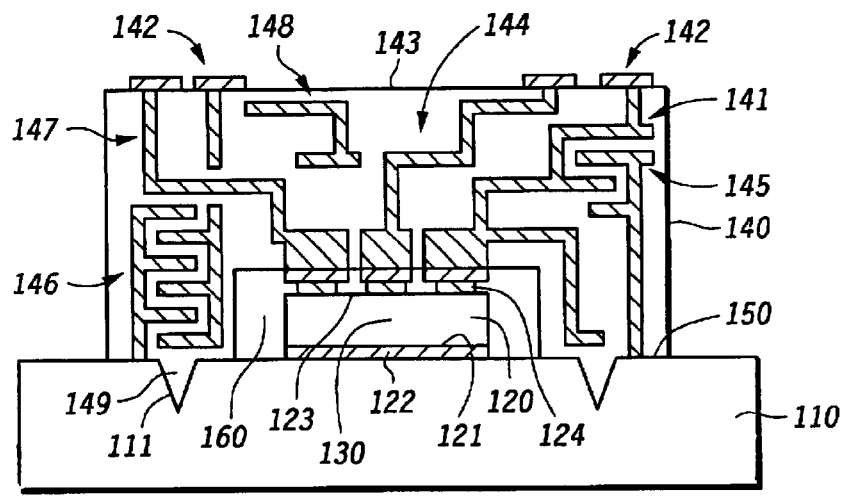
FIG. 1 illustrates a side, cross-sectional view of an electronic component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms front, back, top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

FIG. 1 illustrates a side, cross-sectional view of an electronic component 100. In the embodiment illustrated in FIG. 1, electronic component 100 is a wire bond-less electronic component for use with a circuit external to electronic component 100. As illustrated in FIG. 1, electronic component 100 comprises a support substrate 110. As an example, support substrate 110 can be a flange. In one embodiment, support substrate 110 is used to dissipate heat from an electronic device. In the same embodiment or in a different embodiment, support substrate 110 is used to provide structural support for a thin and fragile device substrate in which the electronic device is located. Support substrate 110 can also be used to provide an electrical ground potential for the electronic device.

In one embodiment, support substrate 110 can be comprised of copper tungsten. The copper tungsten material can be plated with a layer comprised of nickel and then subsequently plated with a layer comprised of gold to provide a solderable surface for support substrate 110. As an example, the layers comprised of nickel and gold can have thicknesses of approximately one to ten micrometers and one to five micrometers, respectively.

In a different embodiment, support substrate 110 can be comprised of copper, aluminum copper, a copper molybdenum laminate or alloy or mixture, a metal matrix composite such as, for example, aluminum silicon carbide, or copper with graphite fibers. In this different embodiment, these different materials can be plated with nickel and gold (so that device substrates having a silicon and gold attachment layer, for example, can be attached to the different materials) or these different materials can be coated with other metal layers such as, for example, titanium, platinum, and gold or titanium, nickel-vanadium, and gold, that are compatible with solders containing tin and gold, tin and lead, tin and indium, or an organic adhesive such as, for example, epoxy or a silver-filled glass.

Electronic component 100 also comprises a device substrate 120. As an example, device substrate 120 can be a semiconductor substrate such as, for example, silicon or gallium arsenide. Device substrate 120 is located on, located over, or supported by support substrate 110. As an example, device substrate 120 can be physically coupled to support substrate 110 by being mounted on and/or over support substrate 110.

A back surface 121 of device substrate 120 can have a backmetal 122. As an example, backmetal 122 can have a thickness of approximately one tenth to two micrometers. Backmetal 122 can form an eutectic bond between device substrate 120 and support substrate 110. As an example, the eutectic bond can be formed by heating backmetal 122 to a temperature of approximately two hundred eighty to five hundred degrees Celsius while applying mechanical agitation to backmetal 122. Also as an example, backmetal 122 can be comprised of gold when electronic component 100 uses a silicon-gold die attach scheme. For other die attach schemes, backmetal 122 can be comprised of titanium, nickel-vanadium, and gold or titanium, platinum, and gold.

Electronic component 100 further comprises an electronic device 130 located over support substrate 110 and supported by and/or manufactured in and over device substrate 120. As an example, electronic device 130 can be a semiconductor device, such as, for example, a discrete device or an integrated circuit. In one embodiment, the discrete device can be an optical device, inductor, capacitor, or transistor. In another embodiment, the discrete device can be a high performance device operating at a high power of approximately one hundred watts or greater and/or operating at a radio frequency or other high frequency of approximately one-hundred megahertz or greater. Additionally, the discrete device can be used for low power level applications of approximately ten watts or greater. As another example, device substrate 120 can support a plurality of discrete devices. In a different embodiment, electronic component 100 can comprise more than one device substrate 120, each of which comprises at least one electronic device 130.

Device substrate 120 can also include an interconnect structure 124 located at a top surface 123 of device substrate 120. As an example, interconnect structure 124 can be comprised of gold flip-chip bumps and/or a multi-layered interconnect system.

Electronic component 100 additionally comprises a cover 140 located over electronic device 130, device substrate 120, and support substrate 110. As an example, cover 140 can be a lid for electronic component 100. Device substrate 120 is located in a recess 160 defined by cover 140 and support substrate 110. In a different embodiment, device substrate 120 can be located in a recess in support substrate 110, in cover 140, or both.

Cover 140 comprises an interconnect structure 141 electrically coupled to electronic device 130. Interconnect structure 141 is adapted to electrically couple together electronic device 130 and a circuit (not shown in FIG. 1) external to electronic component 100. Interconnect structure 141 provides impedance transformation of an electrical signal between electronic device 130 and the external circuit. As an example, interconnect structure 141 can provide impedance transformation of electrical signals from electronic device 130 to the external circuit and can also provide impedance transformation of electrical signals from the external circuit to electronic device 130. As explained in more detail more hereinafter, interconnect structure 141 can be a multi-functional interconnect system.

Figure 2:
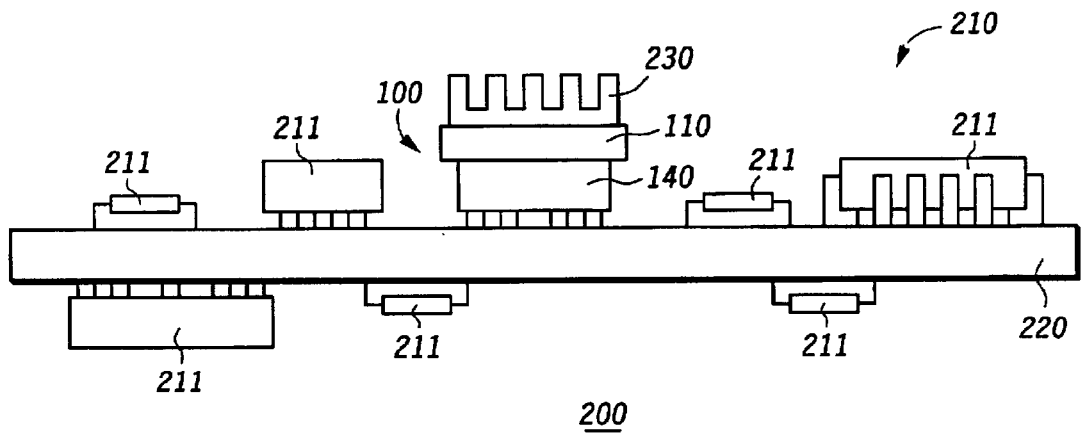
FIG. 2 illustrates a side, elevational view of the electronic component of FIG. 1 in an electronic system in accordance with an embodiment of the invention.

Turning to FIG. 2, which illustrates a side, elevational view of an electronic system 200, electronic component 100 is electrically coupled to a circuit 210 via a circuit board or other interconnect structure 220. Circuit 210 is external to electronic component 100 and can be comprised of one or more of electronic components 211. A heat sink 230 is coupled to support substrate 110 of electronic component 100. Support substrate 110 can be soldered, bolted, or clamped to heat sink 230 or a next level system. As illustrated in FIG. 2, electronic component 100 is a surface mount device.

Returning to FIG. 1, cover 140 can comprise an organic polymer, such as, for example, FR-4, as used in personal computer boards, a polyimide, a polytetrafluoroethylene such as a Teflon® material, or an epoxy. Cover 140 can also comprise metal and dielectric circuit elements. In another embodiment, the above combinations could be a flexible circuit that minimizes stresses. In a different embodiment, cover 140 can comprise a glass ceramic such as, for example, alumina combined with glass, a low temperature co-fired ceramic (LTCC), a high temperature co-fired to ceramic (HTCC), or a combination of such materials with silver, copper, or gold metallization inside and on the surface of the material or materials. In another embodiment, cover 140 can be comprised of aluminum nitride. The specific composition of cover 140 can depend upon numerous factors including the operational and reliability requirements of electronic component 100. The multi-layered structure of cover 140 can be manufactured by techniques known in the art. The act of repairing or replacing cover 140 constitutes a reconstruction, and not a repair, of electronic component 100.

Cover 140 also comprises an interconnect structure 142 located at a top surface 143 of cover 140. As an example, interconnect structure 142 can be comprised of gold, silver, or silver with plated nickel and gold. At a bottom surface 150 of cover 140, cover 140 can comprise a layer of plated platinum silver or finer silver or nickel and nickel gold having a thickness of approximately twenty to fifty micrometers. A layer of an electrically conductive organic polymer or a solder can be located between cover 140 and support substrate 110 to adhere, affix, or otherwise secure cover 140 to support substrate 110. As an example, the electrically conductive solder can be comprised of lead tin, lead silver, or gold tin. As an example, the organic polymer can be an electrically conductive epoxy. Alternatively, cover 140 and support substrate 110 can be directly attached together by applying pressure, heat, ultrasonic, or other forms of energy to the metal portions of cover 140 and support substrate 110 that contact each other.

As mentioned earlier, interconnect structure 141 of cover 140 can provide a variety of direct current and alternating current or high frequency functions. Accordingly, interconnect structure 141 can comprise resistors, inductors, and capacitors. The inductors can be planar and/or helical. The capacitors can be used to resonate out parasitic inductances. The resistors, inductors, and capacitors can be combined together to form lumped element structures and/or inductor-capacitor (LC) ladder networks. The interconnect structure 141 can further comprise discrete components, waveguides, and transmission lines. Interconnect structure 141 can comprise a multi-layered structure or a single layered structure. A portion of interconnect structure 141 can also be located at top surface 143 of cover 140. As an example, the single or multi-layered structures of interconnect structure 141 can be formed by using a direct bonded copper (DBC) process and/or a plated metal process.

In one embodiment, interconnect structure 141 provides a direct current bias for electronic device 130. As an example, interconnect structure 141 can comprise a direct current bias circuit 144 for providing a direct current to electronic device 130. As illustrated in FIG. 1, direct current bias circuit 144 can be implemented entirely separately or independently from the other portions of interconnect structure 141 that provide radio frequency or other high frequency functions.

In a different embodiment or in the same embodiment, interconnect structure 141 can provide a plurality of radio frequency or either high frequency functions. For example, interconnect structure 141 can comprise a subcircuit or other portion 145 for providing impedance matching. Accordingly portion 145 can also be referred to as an impedance matching network or an impedance transformation circuit. Portion 145 can be electrically coupled to both the input and/or the output of electronic device 130. Portion 145 of interconnect structure 141 can also provide harmonic termination of the electrical signal or signals between electronic device 130 and the external circuit to improve the linear performance of electronic device 130.

Electronic component 100 can also be designed to provide grounding in cover 140 that is close to device substrate 120 and electronic device 130. For example, in a different or the same embodiment described in the previous paragraphs, interconnect structure 141 can comprise a subcircuit or portion 146 for providing a zero inductance ground potential for electronic device 130. This zero inductance ground potential can also be referred to as an artificial perfect radio frequency or other high frequency ground potential at the fundamental frequency. Portion 146 of interconnect structure 141 enables electronic component 100 to resonate out inductances resulting from any electrical connection of any distance and enables a predetermined bandwidth of the ground potential. As illustrated in FIG. 1, the zero inductance ground potential can be provided by an electrical terminal electrically coupled to portion 146 of interconnect structure 141. The electrical terminal can be at least partially located over top surface 143 of cover 140. As an example, the electrical terminal can be a portion of interconnect structure 142.

Figure 3:
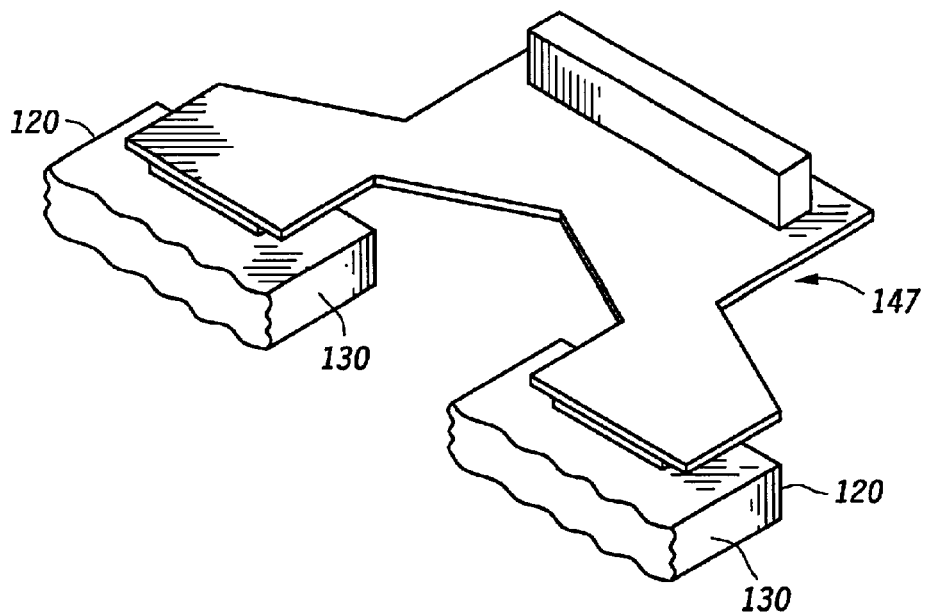
FIG. 3 illustrates a top, isometric view of a portion of the electronic component of FIG. 1 in accordance with an embodiment of the invention.

In a different or the same embodiment, interconnect structure 141 can comprise a power combining manifold 147. Power combining manifold 147 combines the power at the outputs of a plurality of electronic devices similar to electronic device 130. Turning to FIG. 3 which illustrates a top, isometric view of a portion of electronic component 100, power combining manifold 147 is illustrated to combine the power from two electronic devices, similar to electronic device 130, located in two device substrates, similar to device substrate 120. One skilled in the art will understand that power combining manifold 147 can be used to combine the power for more than two electronic devices located in a single or multiple device substrates.

Returning to the embodiment illustrated in FIG. 1, the shape and/or size of interconnect structure 141 is symmetric across cover 140. This symmetry provides a thermal and mechanical balance across cover 140 to reduce warpage and to improve the reliability of cover 140. Accordingly, interconnect structure 141 can include portions such as, for example, a portion 148 that is used to provide symmetry, but that is not used for electrical interconnect purposes. Also in the same embodiment, the portion or portions of interconnect structure 141 used to provide the ground potential for electronic component 100 are located adjacent to the outer perimeter of cover 140. Further in the same embodiment, interconnect structure 141 is embedded or is otherwise located within cover 140. This configuration of interconnect structure 141 enables the reduction in size of electronic component 100.

In one embodiment, cover 140 can be self-aligned to support substrate 110. For example, protrusions 149 of cover 140 can be mated with recesses 111 of support substrate 110 to provide this self-alignment characteristic. As illustrated in FIG. 1, protrusions 149 and recesses 111 each have a triangular cross-section that is complimentary with each other. In a different embodiment, protrusions 149 and recesses 111 are not complimentary in shape with each other. In other embodiment, protrusions 149 and recesses 111 can have other shapes such as, for example, a conical shape, semi-spherical shape, a pyramidal shape, a trapezoidal shape, a rhomboidal shape, or the like.

Figure 4:
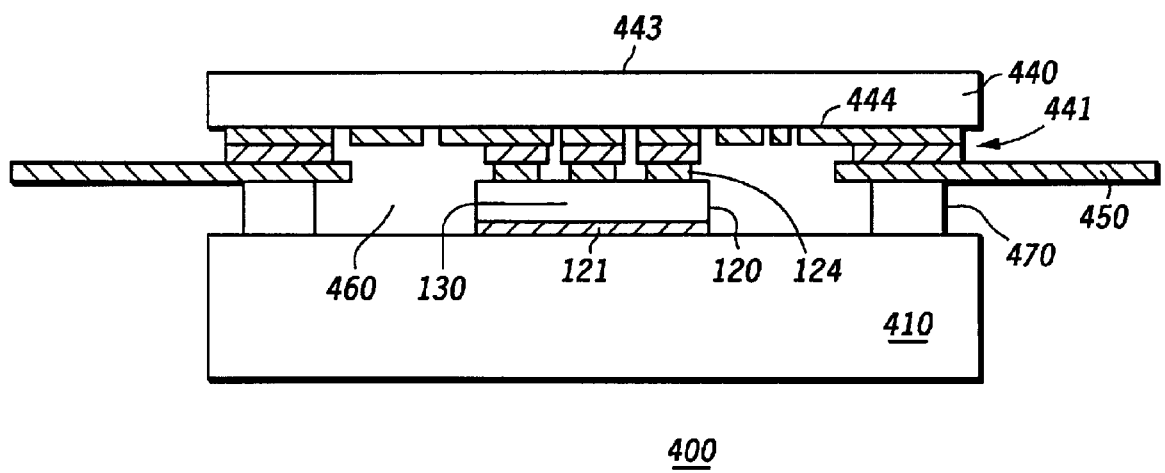
FIG. 4 illustrates a side, cross-sectional view of a different electronic component in accordance with an embodiment of the invention.

FIG. 4 illustrates a side cross-sectional view of an electronic component 400. Electronic component 400 is a different embodiment of electronic component 100 in FIG. 1. As illustrated in FIG. 4, electronic component 400 comprises a support substrate 410, which can be similar to support substrate 110 in FIG. 1. Also illustrated in FIG. 4, electronic component 400 comprises a cover 440, which can be similar to cover 140 in FIG. 1 and can have multiple layers. As illustrated in FIG. 4, cover 440 is not self-aligned to device substrate 120 or support substrate 410. Device substrate 120 is located in a recess 460 defined by cover 440 and support substrate 410.

Cover 440 in FIG. 4 comprises an interconnect structure 441, which can be similar to interconnect structure 141 in FIG. 1. Interconnect structure 441 in FIG. 4, however, is located at or adjacent to a bottom surface 444 of cover 440. In a different embodiment, interconnect structure 441 can be located at a top surface 443 of cover 440. In another embodiment, interconnect structure 441 can be located at surface 444, at surface 443, and/or within cover 440.

Electronic component 400 in FIG. 4 also comprises electrical leads 450 located adjacent to cover 440. Electrical leads 450 are located between cover 440 and support substrate 410. Interconnect structure 441 electrically couples together electronic device 130 and electrical leads 450. Electrical leads electrically coupled together interconnect structure 441 and the circuit external to electronic component 400. One or more standoffs 470 are located between electrical leads 450 and support substrate 410 such that electrical leads 450 are not electrically shorted to support substrate 410.

As an example, electrical leads 450 can be comprised of an iron nickel alloy having a thickness of approximately one tenth to one half millimeter. Electrical leads 450 can also comprise a layer of nickel and a layer of gold over the iron nickel alloy. In a different embodiment, electrical leads 450 can comprise a copper alloy or an iron nickel cobalt alloy or a copper and molybdenum alloy. Electrical leads 450 can be bent to form a surface mount device or a different type of leaded device. Printed circuit board, Kapton, and flex circuit materials can also be used for electrical leads 450.

Figure 5:
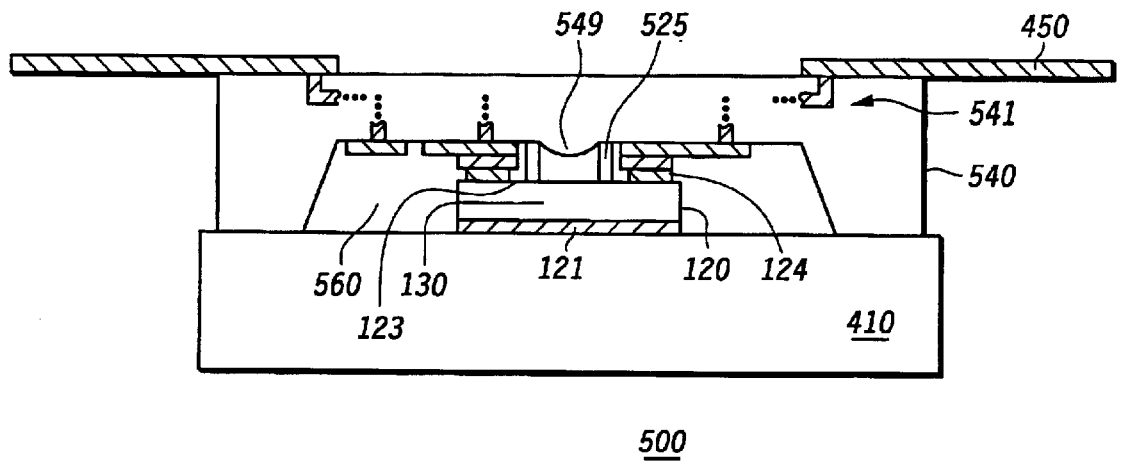
FIG. 5 illustrates a side, cross-sectional view of another electronic component in accordance with an embodiment of the invention.

FIG. 5 illustrates a side, cross-sectional view of an electronic component 500, which is another embodiment of electronic component 100 in FIG. 1. As illustrated in FIG. 5, electronic component 500 comprises a cover 540. Device substrate 120 is located in a recess 560 defined by cover 540 and support substrate 410. Cover 540 comprises an interconnect structure 541 located within cover 540 and located at or adjacent to at least one surface of cover 540. Only a portion of interconnect structure 541 is illustrated for simplicity. Cover 540 is self-aligned to and sealed to device substrate 120.

As an example, cover 540 can include a protrusion 549 to be located within an alignment feature 525 formed over top surface 123 of device substrate 120. As an example, alignment feature 525 can be a plated metal structure for the self-alignment of cover 540 to device substrate 120. In a different embodiment, a ball-bond wetting adhesion technique can be used to self-align cover 540 to device substrate 120. The self-alignment enables a reduction in size of the interconnect pads electrically coupling together interconnect structure 541 and electronic device 130.

Figure 6:
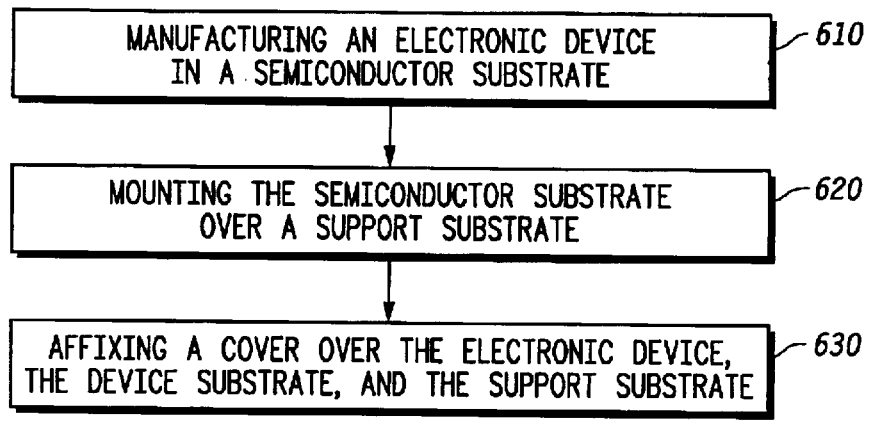
FIG. 6 illustrates a flow chart of a method of manufacturing an electronic component in accordance with an embodiment of the invention.

FIG. 6 illustrates a flow chart 600 of a method of manufacturing an electronic component. As an example, the electronic component of flow chart 600 can be similar to electronic components 100, 400, and/or 500 in FIGS. 1, 4, and 5, respectively.

At a step 610 of flow chart 600, an electronic device is manufactured in a device substrate. At a step 620, the device substrate is mounted over a support substrate. Then at a step 630 of flow chart 600, a cover is affixed over the electronic device, the device substrate, and the support substrate. The cover includes an interconnect structure. As an example, step 630 can also comprise simultaneously electrically coupling together the electronic device and the interconnect structure of the cover. Step 630 can also comprise keeping the electronic component devoid of wire bonds while electrically coupling together the electronic device and the interconnect structure.

Therefore an improved electronic component is provided to overcome the disadvantages of the prior art. The electronic component has an improved operational frequency bandwidth. The electronic component eliminates the needs for wire bonds to provide a lower cost, a shorter manufacturing process, and better electrical performance. The electronic component can also provide a perfect radio frequency ground contact at the top of the component. The location of the interconnect structure within the cover or at least at a surface of the cover also reduces the size of the component.

Although the invention has been described with reference to specific embodiments, it will be understood by those skilled in the art that various changes may be made without departing from the spirit or scope of the invention. For instance, the numerous details set forth herein such as, for example, material compositions, dimensions, and geometries are provided to facilitate the understanding of the invention and are not provided to limit the scope of the invention. Additionally, the support substrate can include coolant tubes to improve heat dissipation. Furthermore, the support substrate can have mounting holes or slots for attachment by screws or other fasteners.

Moreover, various features can be combined with each other. For example, an electronic component in accordance with the invention can be a lead-less, bumped component with a cover self-aligned to the device substrate and with an interconnect structure at a surface of the cover. As another example, an electronic component in accordance with the invention can have leads between a cover and a support substrate and can also have an interconnect structure embedded in the cover where the cover is self-aligned to the support substrate.

Accordingly, the disclosure of embodiments of the invention is intended to be illustrative of the scope of the invention and is not intended to be limiting. It is intended that the scope of the invention shall be limited only to the extent required by the appended claims.

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A wire bond-less electronic component for use with a circuit external to the wire bond-less electronic component, the wire bond-less electronic component comprising:
   a metal support substrate;
   an electronic device over the support substrate; and
   a cover located over the electronic device and the support substrate and comprising:
      an interconnect structure electrically coupled to the electronic device and adapted to electrically couple together the electronic device and the circuit for providing impedance transformation of an electrical signal between the electronic device and the circuit.

2. The wire bond-less electronic component of claim 1 wherein:
   the interconnect structure is located within the cover.

3. The wire bond-less electronic component of claim 1 wherein:
   the interconnect structure is located at a surface of the cover.

4. The wire bond-less electronic component of claim 1 further comprising:
   electrical leads located adjacent to the cover,
   wherein:
      the interconnect structure electrically couples together the electronic device and the electrical leads; and
      the electrical leads electrically couple together the interconnect structure and the circuit.

5. The wire bond-less electronic component of claim 1 wherein:
   the wire bond-less electronic component is a surface mount device.

6. The wire bond-less electronic component of claim 1 wherein:
   the cover is self-aligned to the support substrate.

7. The wire bond-less electronic component of claim 1 wherein:
   the electronic device is located in a device substrate; and
   the cover is self-aligned to the device substrate.

8. The wire bond-less electronic component of claim 1 wherein:
   the impedance transformation provided by the interconnect structure comprises:
      a zero inductance ground potential for the electronic device.

9. The wire bond-less electronic component of claim 8 further comprising:
   an electrical terminal at least partially located over the cover,
   wherein:
      the electrical terminal is electrically coupled to a portion of the interconnect structure providing the zero inductance ground potential.

10. The wire bond-less electronic component of claim 9 wherein:

the cover comprises an outer perimeter; and the portion of the interconnect structure providing the zero inductance ground potential is located adjacent to the outer perimeter of the cover.

11. The wire bond-less electronic component of claim 1 wherein:
the interconnect structure comprises:
a matching network.

12. The wire bond-less electronic component of claim 1 wherein: the interconnect structure comprises:
a first portion comprising a direct current bias circuit; and
a second portion comprising an impedance transformation circuit.

13. The wire bond-less electronic component of claim 1 wherein:
the interconnect structure comprises:
a combining manifold.

14. The wire bond-less electronic component of claim 1 wherein:
the interconnect structure provides harmonic termination of the electrical signal between the electronic device and the circuit.

15. The wire bond-less electronic component of claim 1 further comprising:
an additional electronic device over the support substrate, under the cover, adjacent to the electronic device, and electrically coupled to the interconnect structure.

16. The wire bond-less electronic component of claim 1 wherein:
the interconnect structure is a multi-layer interconnect structure.

17. The wire bond-less electronic component of claim 1 further comprising:
an electrically floating portion located within the cover.

18. A wire bond-less electronic component for use with a circuit external to the wire bond-less electronic component, the wire bond-less electronic component comprising:
a metal flange;
a semiconductor substrate supported by the flange;
a semiconductor device supported by the semiconductor substrate; and
a lid located over the semiconductor device, the semiconductor substrate, and the flange, the lid comprising:
a multi-functional interconnect system electrically coupled to the semiconductor device and electrically coupling together the semiconductor device and the circuit for providing a direct current to the semiconductor device and for providing impedance transformation of electrical signals from the semiconductor device to the circuit and from the circuit to the semiconductor device.

19. The wire bond-less electronic component of claim 18 wherein:
the multi-functional interconnect system is embedded in the lid.

20. The wire bond-less electronic component of claim 18 wherein:
the multi-functional interconnect system is located below and adjacent to a bottom surface of the lid.

21. The wire bond-less electronic component of claim 18 wherein:
the lid is self-aligned to the flange.

22. The wire bond-less electronic component of claim 18 wherein:
the lid is self-aligned to the semiconductor substrate.

23. The wire bond-less electronic component of claim 18 wherein:
the multi-functional interconnect system comprises:
a direct current bias circuit for providing the direct current to the semiconductor device, and
an impedance transformation circuit for providing the impedance transformation of the electrical signals from the semiconductor device to the circuit and from the circuit to the semiconductor device; and
a power combining manifold.

24. The wire bond-less electronic component of claim 23 wherein:
the direct current bias circuit is entirely separate from the impedance transformation circuit.

25. The wire bond-less electronic component of claim 23 wherein:
the impedance transformation circuit further provides harmonic termination of the electrical signals from the semiconductor device to the circuit and from the circuit to the semiconductor device.

* * * * *